(12) United States Patent
Yao et al.

(10) Patent No.: US 12,091,545 B2
(45) Date of Patent: Sep. 17, 2024

(54) RESIN COMPOSITION AND ARTICLE MADE THEREFROM

(71) Applicant: Elite Electronic Material (KunShan) Co., Ltd., Kunshan (CN)

(72) Inventors: Xingxing Yao, Kunshan (CN); Rongtao Wang, Kunshan (CN); Ningning Jia, Kunshan (CN)

(73) Assignee: ELITE ELECTRONIC MATERIAL (KUNSHAN) CO., LTD., Kunshan (CN)

( * ) Notice: Subject to any disclaimer, the term of this patent is extended or adjusted under 35 U.S.C. 154(b) by 0 days.

(21) Appl. No.: 18/224,722

(22) Filed: Jul. 21, 2023

(65) Prior Publication Data

US 2023/0357570 A1 Nov. 9, 2023

Related U.S. Application Data

(62) Division of application No. 16/863,415, filed on Apr. 30, 2020, now Pat. No. 11,753,543.

(30) Foreign Application Priority Data

Feb. 13, 2020 (CN) .......................... 202010089522.9

(51) Int. Cl.
| | | |
|---|---|---|
| C08L 79/08 | (2006.01) | |
| C08J 5/18 | (2006.01) | |
| C08J 5/24 | (2006.01) | |
| C08L 33/10 | (2006.01) | |
| C08L 37/00 | (2006.01) | |

(Continued)

(52) U.S. Cl.
CPC ............... *C08L 79/08* (2013.01); *C08J 5/18* (2013.01); *C08J 5/244* (2021.05); *C08J 5/246* (2021.05); *C08L 33/10* (2013.01); *C08L 37/00* (2013.01); *C08L 83/04* (2013.01); *H05K 1/095* (2013.01); *C08J 2333/10* (2013.01); *C08J 2337/00* (2013.01); *C08J 2363/00* (2013.01); *C08J 2383/04* (2013.01); *C08K 3/013* (2018.01); *C08K 5/0025* (2013.01); *C08K 5/0066* (2013.01); *C08L 2207/53* (2013.01); *H05K 1/188* (2013.01)

(58) Field of Classification Search
CPC .................................................. C08L 79/08
See application file for complete search history.

(56) References Cited

U.S. PATENT DOCUMENTS 10,414,916 B2 * 9/2019 Yao .................. C08L 79/02
2009/0294057 A1 * 12/2009 Liang ................ C09J 163/00
523/438

(Continued)

*Primary Examiner* — William D Young
(74) *Attorney, Agent, or Firm* — MUNCY, GEISSLER, OLDS & LOWE, P.C.

(57) ABSTRACT

A resin composition includes a core-shell rubber, a vinyl-containing benzoxazine resin and a maleimide resin, wherein the core-shell rubber has a core-shell ratio of 6.0:4.0 to 9.5:0.5. The resin composition may be used to make various articles, such as a prepreg, a resin film, a laminate or a printed circuit board, and achieves improvements in at least one, more or all of the properties including dissipation factor, copper foil peeling strength (3 μm copper foil), ten-layer board T300 thermal resistance, ten-layer board glass transition temperature, ten-layer board delamination temperature, inner resin flow, and resin filling property of open area.

8 Claims, 4 Drawing Sheets

(51) Int. Cl.
  *C08L 83/04* (2006.01)
  *H05K 1/09* (2006.01)
  *C08K 3/013* (2018.01)
  *C08K 5/00* (2006.01)
  *H05K 1/18* (2006.01)

(56) References Cited

U.S. PATENT DOCUMENTS

2014/0199549 A1* 7/2014 Shin .................... C08G 59/186
 525/326.7
2022/0056225 A1* 2/2022 Chen .................... C08G 73/127

\* cited by examiner

RESIN COMPOSITION AND ARTICLE MADE THEREFROM

CROSS-REFERENCE TO RELATED APPLICATION

This application is a Divisional of co-pending application Ser. No. 16/863,415, filed on Apr. 30, 2020, for which priority is claimed under 35 U.S.C. § 120; and this application claims the priority benefits of China Patent Application No. 202010089522.9, filed on Feb. 13, 2020, the entirety of all of which are hereby incorporated by reference.

BACKGROUND

1. Field of the Disclosure

The present disclosure relates to a resin composition and an article made therefrom and more particularly to a resin composition useful for preparing an article such as a prepreg, a resin film, a laminate or a printed circuit board.

2. Description of Related Art

With the advent of the 5G generation, technology upgrade of printed circuit boards for mobile communication and automobile electronics requires the fundamental insulation materials in printed circuit boards to achieve not only low dielectric properties and high reliability, but also high thermal resistance and excellent flowability, so as to meet the processability requirements of printed circuit boards involving multiple lamination processes and multiple assembly operations. Conventionally, to achieve high reliability, maleimide resins were usually used in conjunction with benzoxazine resins to make laminates and printed circuit boards; however, the combination of maleimide resins and conventional benzoxazine resins fails to meet the demands in low dielectric properties, high copper foil peeling strength, high thermal resistance and excellent flowability.

SUMMARY

In view of the problems facing prior arts, particularly one or more technical problems associated with conventional materials failing to meet the demands of dissipation factor, copper foil peeling strength (3 μm copper foil), ten-layer board T300 thermal resistance, ten-layer board glass transition temperature, ten-layer board delamination temperature, inner resin flow, resin filling property in open area, etc., the present disclosure provides a resin composition, based on 100 parts by weight of a maleimide resin, comprising:
 (A) 1 part by weight to 15 parts by weight of a core-shell rubber;
 (B) 5 parts by weight to 35 parts by weight of a vinyl-containing benzoxazine resin; and
 (C) 100 parts by weight of the maleimide resin,
 the core-shell rubber having a core-shell ratio of 6.0:4.0 to 9.5:0.5.

Unless otherwise specified, according to the resin composition of the present disclosure, the amount of each component contained in the resin composition is represented as the amount relative to 100 parts by weight of the maleimide resin. For example, in the resin composition of the present disclosure, relative to 100 parts by weight of the maleimide resin, the amount of the core-shell rubber may be 1 part by weight to 15 parts by weight, and the amount of the vinyl-containing benzoxazine resin may be 5 parts by weight to 35 parts by weight.

The core-shell rubber is a polymer having a core-shell structure. The core is encapsulated by the shell and is composed of a polymer. Ingredients of the core and shell are not particularly limited and may comprise materials used in the field to which this disclosure pertains for various core-shell rubbers, examples including but not limited to diene polymer, polysiloxane or a combination thereof used as the core and (meth)acrylate polymer used as the shell. These components should be construed as including their modifications.

Examples of the vinyl-containing benzoxazine resin are not particularly limited and may comprise various benzoxazine resins having at least one vinyl group known in the art to which this disclosure pertains; examples include but are not limited to a prepolymer of olefin compound and benzoxazine resin, a prepolymer of acrylate compound and benzoxazine resin, a prepolymer of vinyl-containing acyl chloride compound and benzoxazine resin, a vinyl-containing bisphenol A benzoxazine resin, a vinyl-containing bisphenol F benzoxazine resin, a vinyl-containing phenolphthalein benzoxazine resin, a vinyl-containing dicyclopentadiene benzoxazine resin, a vinyl-containing phosphorus-containing benzoxazine resin, a vinyl-containing oxydianiline benzoxazine resin, a vinyl-containing diamino bisphenol F benzoxazine resin, a vinyl-containing diamino diphenyl benzoxazine resin or a combination thereof. These components should be construed as including their modifications.

Examples of the maleimide resin are not particularly limited and may comprise various maleimide resins known in the art to which this disclosure pertains; examples include 4,4'-diphenylmethane bismaleimide, polyphenylmethane maleimide, bisphenol A diphenyl ether bismaleimide, 3,3'-dimethyl-5,5'-diethyl-4,4'-diphenylmethane bismaleimide, 3,3'-dimethyl-5,5'-dipropyl-4,4'-diphenylmethane bismaleimide, m-phenylene bismaleimide, 4-methyl-1,3-phenylene bismaleimide, 1,6-bismaleimide-(2,2,4-trimethyl)hexane, N-2,3-xylylmaleimide, N-2,6-xylyl maleimide, N-phenylmaleimide, vinyl benzyl maleimide, maleimide resin containing aliphatic long chain structure, prepolymer of diallyl compound and maleimide resin, prepolymer of diamine and maleimide resin, prepolymer of multi-functional amine and maleimide resin, prepolymer of acid phenol compound and maleimide resin, or a combination thereof. These components should be construed as including their modifications.

In addition to the core-shell rubber, the vinyl-containing benzoxazine resin and the maleimide resin, the resin composition disclosed herein may optionally further comprise polyphenylene ether resin, cyanate ester resin, active ester, vinylbenzyl-dicyclopentadiene phenylene ether, bis(vinylbenzyl)ether, 1,2-bis(vinyl phenyl)ethane, divinylbenzene, triallyl isocyanurate, triallyl cyanurate, 1,2,4-trivinyl cyclohexane, diallyl bisphenol A, styrene, acrylate, polyolefin, epoxy resin, phenolic resin, styrene maleic anhydride resin, amine curing agent, polyamide, polyimide, or a combination thereof. These components should be construed as including their modifications.

In addition to the core-shell rubber, the vinyl-containing benzoxazine resin and the maleimide resin, the resin composition disclosed herein may optionally further comprise flame retardant, inorganic filler, curing accelerator, polymerization inhibitor, solvent, silane coupling agent, surfactant, coloring agent, toughening agent or a combination thereof.

The resin compositions of various embodiments may be useful for making different articles, including but not limited to a prepreg, a resin film, a laminate or a printed circuit board.

In a preferred embodiment, articles made from the resin composition disclosed herein have one, more or all of the following properties:

in one embodiment, a dissipation factor at 10 GHz as measured by reference to JIS C2565 is less than or equal to 0.0072;

in one embodiment, a copper foil (3 μm copper foil) peeling strength as measured by using a tensile strength tester by reference to IPC-TM-650 2.4.8 is greater than or equal to 5.5 lb/in;

in one embodiment, a ten-layer board T300 thermal resistance as measured by reference to IPC-TM-650 2.4.24.1 is greater than 130 minutes;

in one embodiment, a ten-layer board glass transition temperature as measured by using a dynamic mechanical analyzer by reference to IPC-TM-650 2.4.24.4 is greater than or equal to 320° C.;

in one embodiment, a ten-layer board delamination temperature as measured by using a dynamic mechanical analyzer by reference to IPC-TM-650 2.4.24.4 is greater than or equal to 350° C.;

in one embodiment, an inner resin flow as measured from a lamination resin flow test is greater than or equal to 6.0 mm; and in one embodiment, the article is absent of branch-like pattern and void in an open area as observed from a resin filling property test of the open area.

DESCRIPTION OF THE EMBODIMENTS

Figure 1:
FIG. 1 illustrates the branch-like pattern in the open area.

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

While some theories or mechanisms may be proposed herein, the present disclosure is not bound by any theories or mechanisms described regardless of whether they are right or wrong, as long as the embodiments can be implemented according to the present disclosure.

As used herein, "a," "an" or any similar expression is employed to describe components and features of the present disclosure. This is done merely for convenience and to give a general sense of the scope of the present disclosure. Accordingly, this description should be read to include one or at least one and the singular also includes the plural unless it is obvious to mean otherwise.

As used herein, "or a combination thereof" means "or any combination thereof", and "any" means "any one", vice versa.

As used herein, the term "encompasses," "encompassing," "comprises," "comprising," "includes," "including," "has," "having" or any other variant thereof is construed as an open-ended transitional phrase intended to cover a non-exclusive inclusion. For example, a composition or manufacture that comprises a list of elements is not necessarily limited to only those elements but may include other elements not expressly listed or inherent to such composition or manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "encompasses," "encompassing," "comprises," "comprising," "includes," "including," "has," "having" or any other variant thereof, it is understood that close-ended transitional phrases such as "consisting of," "composed by" and "remainder being" and partially open transitional phrases such as "consisting essentially of," "primarily consisting of," "mainly consisting of," "primarily containing," "composed essentially of," "essentially having," etc. are also disclosed and included.

In this disclosure, features and conditions such as values, numbers, contents, amounts or concentrations are presented as a numerical range or a percentage range merely for convenience and brevity. Therefore, a numerical range or a percentage range should be interpreted as encompassing and specifically disclosing all possible subranges and individual numerals or values therein, including integers and fractions, particularly all integers therein. For example, a range of "1.0 to 8.0" or "between 1.0 and 8.0" should be understood as explicitly disclosing all subranges such as 1.0 to 8.0, 1.0 to 7.0, 2.0 to 8.0, 2.0 to 6.0, 3.0 to 6.0, 4.0 to 8.0, 3.0 to 8.0 and so on and encompassing the endpoint values, particularly subranges defined by integers, as well as disclosing all individual values in the range such as 1.0, 2.0, 3.0, 4.0, 5.0, 6.0, 7.0 and 8.0. Unless otherwise defined, the aforesaid interpretation rule should be applied throughout the present disclosure regardless of broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$" and Y is described as being "selected from a group consisting of $Y_1$, $Y_2$ and $Y_3$," the disclosure encompasses any combination of X is $X_1$ and/or $X_2$ and/or $X_3$ and Y is $Y_1$ and/or $Y_2$ and/or $Y_3$.

Unless otherwise specified, according to the present disclosure, a compound refers to a chemical substance formed by two or more elements bonded with chemical bonds and may comprise a small molecule compound and a polymer compound, but not limited thereto. Any compound disclosed herein is interpreted to not only include a single chemical substance but also include a class of chemical substances having the same kind of components or having the same property.

Unless otherwise specified, according to the present disclosure, a polymer refers to the product formed by monomer(s) via polymerization and usually comprises multiple aggregates of polymers respectively formed by multiple repeated simple structure units by covalent bonds; the monomer refers to the compound forming the polymer. A polymer may comprise a homopolymer, a copolymer, a prepolymer, etc., but not limited thereto. A prepolymer refers to a polymer having a lower molecular weight between the molecular weight of monomer and the molecular weight of final polymer. For example, according to the present disclosure, a prepolymer of olefin compound and benzoxazine resin refers to a product with an intermediate molecular weight obtained by subjecting the olefin compound and benzoxazine resin to a certain degree of polymerization, the intermediate molecular weight being greater than the molecular weight of the olefin compound and benzoxazine resin before reaction but less than the molecular weight of the final product obtained from a complete reaction; in addition, the prepolymer contains a reactive functional group capable of participating further polymerization to obtain the final high molecular weight product which has been fully crosslinked or cured. The term "polymer" includes but is not limited to an oligomer. An oligomer refers to a polymer with 2-20, typically 2-5, repeating units. For example, the term "diene polymer" as used herein is construed as comprising diene homopolymer, diene copolymer, diene prepolymer and diene oligomer. For example, the term "(meth)acrylate polymer" as used herein is construed as comprising (meth)acrylate homopolymer, (meth)acrylate copolymer, (meth)acrylate prepolymer and (meth)acrylate oligomer.

Unless otherwise specified, the term "resin" of the present disclosure is a widely used common name of a synthetic polymer and is construed as comprising monomer and its combination, polymer and its combination or a combination of monomer and its polymer, but not limited thereto. For example, in the present disclosure, the term "vinyl-containing benzoxazine resin" is construed to encompass a vinyl-containing benzoxazine monomer, a vinyl-containing benzoxazine polymer, a combination of vinyl-containing benzoxazine monomers, a combination of vinyl-containing benzoxazine polymers, and a combination of vinyl-containing benzoxazine monomer(s) and vinyl-containing benzoxazine polymer(s). For example, in the present disclosure, the term "vinyl-containing" is construed to encompass the inclusion of a vinyl group, an allyl group, a (meth)acrylate group or a combination thereof. Similarly, in the present disclosure, the term "maleimide resin" is construed to encompass a maleimide monomer, a maleimide polymer, a combination of maleimide monomers, a combination of maleimide polymers, and a combination of maleimide monomer(s) and maleimide polymer(s).

Unless otherwise specified, according to the present disclosure, a modification comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc.

The unsaturated bond described herein, unless otherwise specified, refers to a reactive unsaturated bond, such as but not limited to an unsaturated double bond with the potential of being crosslinked with other functional groups, such as an unsaturated carbon-carbon double bond with the potential of being crosslinked with other functional groups, but not limited thereto.

Unless otherwise specified, according to the present disclosure, when the term acrylate or acrylonitrile is expressed as (meth)acrylate or (meth)acrylonitrile, it is intended to comprise both situations of containing and not containing a methyl group; for example, poly(meth)acrylate is construed as including polyacrylate and polymethacrylate. For example, (meth)acrylonitrile is construed as including acrylonitrile and methacrylonitrile.

Unless otherwise specified, the alkyl and alkenyl groups disclosed herein should be construed as comprising various isomers thereof. For example, propyl should be construed as comprising n-propyl and isopropyl.

Unless otherwise specified, as used herein, part(s) by weight represents weight part(s) in any weight unit, such as but not limited to kilogram, gram, pound and so on. For example, 100 parts by weight of the maleimide resin may represent 100 kilograms of the maleimide resin or 100 pounds of the maleimide resin.

It should be understood that all features disclosed herein may be combined in any way to constitute the solution of the present disclosure, as long as there is no conflict present in the combination of these features.

Examples and embodiments are described in detail below. It will be understood that these examples and embodiments are exemplary only and are not intended to limit the scope and use of the present disclosure. Unless otherwise specified, processes, reagents and conditions described in the examples are those known in the art.

For example, the present disclosure provides a resin composition, based on 100 parts by weight of a maleimide resin, the resin composition comprising:
  (A) 1 part by weight to 15 parts by weight of a core-shell rubber;
  (B) 5 parts by weight to 35 parts by weight of a vinyl-containing benzoxazine resin; and
  (C) 100 parts by weight of the maleimide resin,
  the core-shell rubber having a core-shell ratio of 6.0:4.0 to 9.5:0.5.

In some embodiments, the amount of the core-shell rubber in the resin composition may be 1 part by weight to 5 parts by weight, 5 parts by weight to 10 parts by weight, or 10 parts by weight to 15 parts by weight.

In some embodiments, the amount of the vinyl-containing benzoxazine resin in the resin composition may be 5 parts by weight to 20 parts by weight, 20 parts by weight to 25 parts by weight, or 25 parts by weight to 35 parts by weight.

The core-shell rubber is a polymer having a core-shell structure. The core is encapsulated by the shell and is composed of a polymer. The core-shell ratio refers to the weight ratio of core to shell in the core-shell rubber. In some embodiments, the core-shell rubber has a core-shell ratio of for example 6.0:4.0, 6.5:3.5, 7.0:3.0, 7.5:2.5, 8.0:2.0, 8.5:1.5, 9.0:1.0 or 9.5:0.5, but not limited thereto.

Ingredients of the core and shell are not particularly limited and may comprise materials used in the field to which this disclosure pertains for various core-shell rubbers, examples including but not limited to diene polymer, polysiloxane (a.k.a. silicone) or a combination thereof used as the core and (meth)acrylate polymer used as the shell. These components should be construed as including their modifications.

Examples of the diene polymer is not particularly limited and may comprise a diene homopolymer, a copolymer of diene and other unsaturated bond-containing compound, a prepolymer of diene and other unsaturated bond-containing compound and a diene oligomer. For example, the diene polymer may comprise but not limited to polybutadiene, copolymer of butadiene and styrene (i.e., styrene-butadiene rubber), copolymer of butadiene and (meth)acrylonitrile, polyisoprene, copolymer of isoprene and (meth)acrylonitrile, copolymer of isoprene and styrene, or a combination thereof.

Examples of the polysiloxane are not particularly limited and may comprise various polysiloxanes used in the field to which this disclosure pertains, including but not limited to polydimethylsiloxane, polyethylsiloxane, polyphenylsiloxane or a combination thereof.

Examples of the (meth)acrylate polymer are not particularly limited and may comprise various (meth)acrylate polymers used in the field to which this disclosure pertains, including but not limited to poly(methyl (meth)acrylate), poly(butyl (meth)acrylate) or a combination thereof. The poly(methyl (meth)acrylate) may comprise but not limited to poly(methyl acrylate), poly(methyl methacrylate) or a combination thereof.

Examples of the vinyl-containing benzoxazine resin are not particularly limited and may comprise various benzoxazine resins containing at least one vinyl group used in the field to which this disclosure pertains; these reactive vinyl groups have the potential of crosslinking with other unsaturated bond-containing resins (such as but not limited to maleimide resin) in the resin composition, thereby effectively improving the compatibility of the resin system and the thermal resistance of the product after curing.

Examples of the vinyl-containing benzoxazine resin suitable for the present disclosure comprise, but not limited to, a prepolymer of olefin compound and benzoxazine resin, a prepolymer of acrylate compound and benzoxazine resin, a prepolymer of vinyl-containing acyl chloride compound and benzoxazine resin, a vinyl-containing bisphenol A benzoxazine resin, a vinyl-containing bisphenol F benzoxazine resin, a vinyl-containing phenolphthalein benzoxazine resin, a vinyl-containing dicyclopentadiene benzoxazine resin, a vinyl-containing phosphorus-containing benzoxazine resin, a vinyl-containing oxydianiline benzoxazine resin, a vinyl-containing diamino bisphenol F benzoxazine resin, a vinyl-containing diamino diphenyl benzoxazine resin or a combination thereof. These components should be construed as including their modifications.

The prepolymer of olefin compound and benzoxazine resin refers to a product of a prepolymerization reaction of the olefin compound and the benzoxazine resin under proper conditions. During the prepolymerization of olefin compound and benzoxazine resin, some unsaturated bonds of the olefin compound and hydroxyl groups of the benzoxazine resin formed after ring opening are subject to an etherization reaction in the presence of a catalyst, such that some or all of the hydroxyl groups are consumed, thereby obtaining the prepolymer of olefin compound and benzoxazine resin in which some residual unsaturated bond-containing reactive groups are present. The olefin compound may comprise but not limited to an olefin monomer or an olefin polymer containing two or more unsaturated bonds per molecule as known in the art to which this disclosure pertains. Examples comprise but not limited to styrene-butadiene-divinylbenzene terpolymer, styrene-butadiene-maleic anhydride terpolymer, vinyl-polybutadiene-urethane oligomer, styrene-butadiene copolymer, styrene-isoprene copolymer, maleic anhydride-butadiene copolymer, polybutadiene, polyisoprene, butadiene, dicyclopentadiene, bis(vinylbenzyl)ether, 1,2-bis(vinylphenyl) ethane, divinylbenzene, triallyl isocyanurate, triallyl cyanurate, 1,2,4-trivinyl cyclohexane, or a combination thereof.

The prepolymer of acrylate compound and benzoxazine resin refers to a product of a prepolymerization reaction of the acrylate compound and the benzoxazine resin under proper conditions. During the prepolymerization of acrylate compound and benzoxazine resin, some unsaturated bonds of the acrylate compound and hydroxyl groups of the benzoxazine resin formed after ring opening are subject to an etherization reaction in the presence of a catalyst, such that some or all of the hydroxyl groups are consumed, thereby obtaining the prepolymer of acrylate compound and benzoxazine resin in which some residual unsaturated bond-containing reactive groups are present. Examples of the acrylate compound are not particularly limited and may comprise but not limited to a bifunctional acrylate, a trifunctional acrylate and a multifunctional acrylate containing two or more unsaturated bonds per molecule as known in the art to which this disclosure pertains. Examples comprise but not limited to cyclohexane dimethanol di(meth)acrylate, ethylene glycol di(meth)acrylate, 1,4-butylene glycol di(meth)acrylate, ethoxylated bisphenol A di(meth)acrylate, tricyclodecane di(meth)acrylate, trimethylolpropane tri(meth)acrylate, [(octahydro-4,7-methano-1H-indene-5,6-diyl)bis(methylene)] di(meth)acrylate, tris(2-hydroxyethyl) isocyanurate tri(meth)acrylate, trimethylolpropane tri(meth)acrylate, ethoxylated trimethylolpropane tri(meth)acrylate, pentaerythritol tetra(meth)acrylate, or a combination thereof. For example, the acrylate compound may be those available from Sartomer under the tradenames of CD series, SR series, DPHA, and TFN series.

The prepolymer of vinyl-containing acyl chloride compound and benzoxazine resin refers to a product of a prepolymerization reaction of the vinyl-containing acyl chloride compound and the benzoxazine resin under proper conditions. During the prepolymerization of vinyl-containing acyl chloride compound and benzoxazine resin, the chloride atoms of the vinyl-containing acyl chloride compound and hydroxyl groups of the benzoxazine resin formed after ring opening are subject to a halogen substitution reaction in the presence of an alkaline solution to introduce the vinyl-containing acyl group to the benzoxazine resin structure, such that some or all of the hydroxyl groups are consumed, thereby obtaining the prepolymer of vinyl-containing acyl chloride compound and benzoxazine resin in which some residual unsaturated bond-containing reactive groups are present. Examples of the vinyl-containing acyl chloride compound are not particularly limited and may comprise various acyl chloride compounds containing one or more unsaturated bonds per molecule known in the art to which this disclosure pertains. Examples include but are not limited to methacryloyl chloride, cinnamyl chloride, crotonyl chloride, trans-8-methyl-6-nonanoyl chloride, 10-undecenoyl chloride or a combination thereof.

During the prepolymerization process, examples of the benzoxazine resin are not particularly limited and may comprise various benzoxazine resins known in the art to which this disclosure pertains; examples include but are not limited to bisphenol A benzoxazine resin, bisphenol F benzoxazine resin, phenolphthalein benzoxazine resin, dicyclopentadiene benzoxazine resin, phosphorus-containing benzoxazine resin, diamino benzoxazine resin, vinyl-containing benzoxazine resin, or a combination thereof. The diamino benzoxazine resin may include oxydianiline benzoxazine resin, diamino bisphenol F benzoxazine resin, diamino diphenyl benzoxazine resin, or a combination thereof. For example, the benzoxazine resin may be, but not limited to, LZ-8270, LZ-8280, LZ-8290 or LPY 11051 sold by Huntsman, PF-3500 sold by Chang Chun Plastics or HFB-2006M sold by Showa High Polymer.

In some embodiments, the vinyl-containing benzoxazine resin suitable for the present disclosure may comprise any one or more commercially available products, self-prepared products, or a combination thereof. For example, the commercial products may be available from Kolon and Huntsman, but not limited thereto.

Preferably, the vinyl-containing benzoxazine resin comprises a prepolymer of polybutadiene and benzoxazine resin, a prepolymer of dicyclopentadiene and benzoxazine resin, a prepolymer of tris(2-hydroxyethyl) isocyanurate triacrylate and benzoxazine resin, a prepolymer of methacryloyl chloride and benzoxazine resin, an allyl-containing bisphenol A benzoxazine resin, an allyl-containing bisphenol F benzoxazine resin, an allyl-containing dicyclopentadiene benzoxazine resin, an allyl-containing diamino benzoxazine resin or a combination thereof.

More preferably, the vinyl-containing benzoxazine resin comprises, but not limited to, a resin of Formula (1), a resin of Formula (2), a resin of Formula (3), a resin of Formula (4), a resin of Formula (5), a resin of Formula (6), a resin of Formula (7), a resin of Formula (8) or a combination thereof.

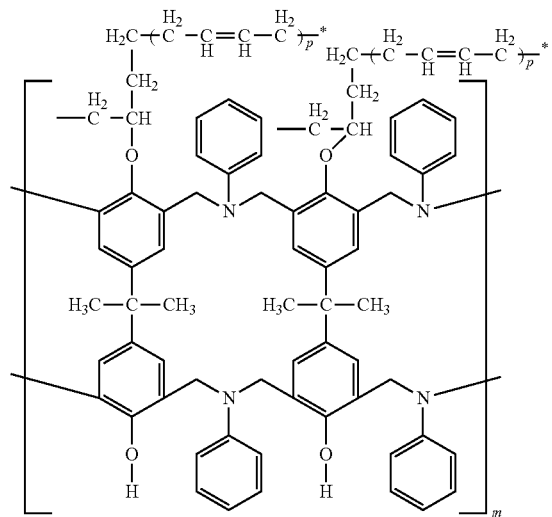

Formula (1)

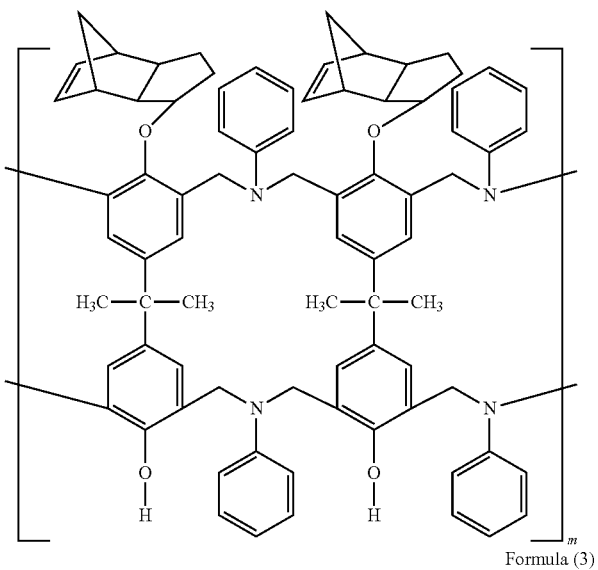

Formula (2)

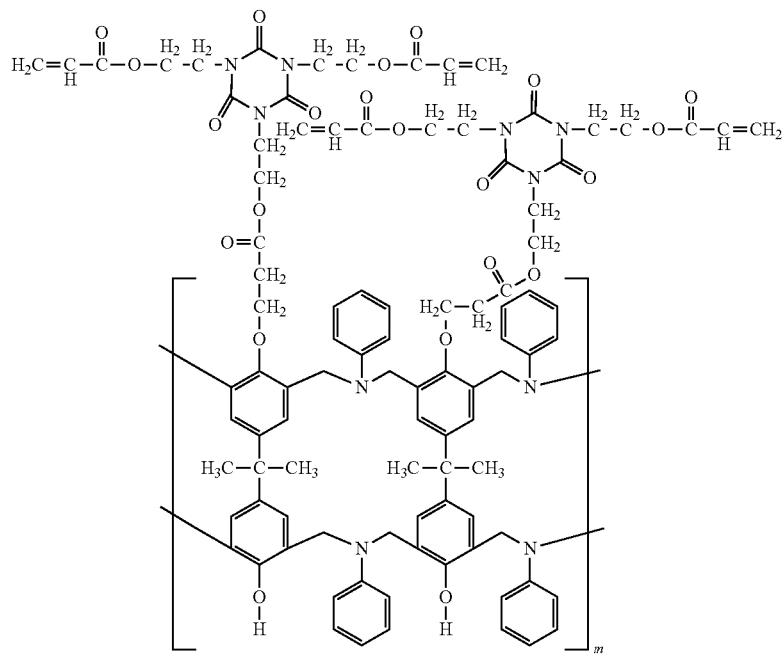

Formula (3)

-continued

Formula (4)

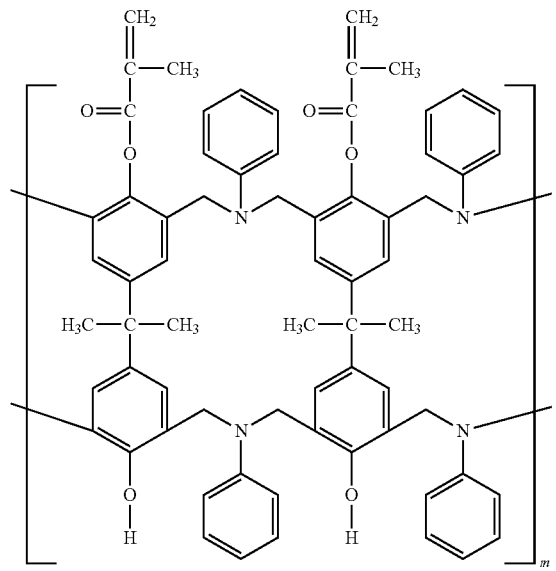

Formula (5)

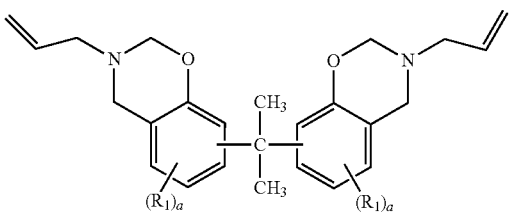

Formula (6)

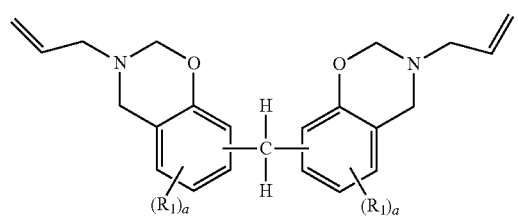

Formula (7)

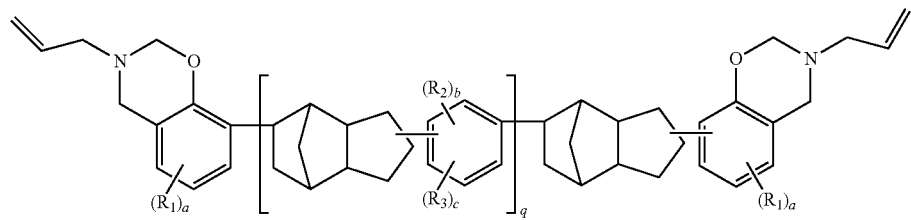

Formula (8)

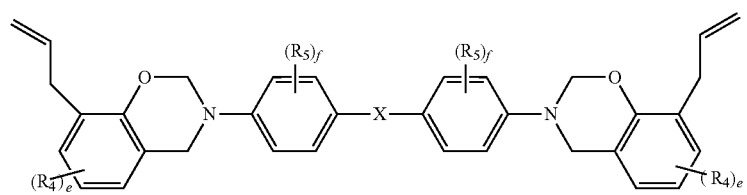

wherein m is an integer of 1 to 10, preferably an integer of 1 to 3; p is an integer of 0 to 25, preferably an integer of 1 to 15, and more preferably an integer of 1 to 10; q is an integer of 1 to 10, preferably an integer of 1 to 3; a and e are independently an integer of 0 to 3; b, c and f are independently an integer of 0 to 4;

$R_1$, $R_4$ and $R_5$ independently represent hydrogen, substituted or non-substituted alkyl group, or substituted or non-substituted alkenyl group, preferably hydrogen, methyl group or allyl group;

$R_2$ and $R_3$ independently represent hydrogen, oxygen-containing group, substituted or non-substituted alkyl group, or substituted or non-substituted alkenyl group, wherein $R_2$ and $R_3$ preferably are hydrogen, hydroxyl group or methyl group; and X is a covalent bond, —O—, —$CH_2$—, —CH($CH_3$)— or —C($CH_3$)$_2$—, preferably —O— or —C($CH_3$)$_2$—.

The maleimide resin of the present disclosure comprises a monomer containing at least one maleimide group, its polymer, or a combination thereof. Unless otherwise specified, the maleimide resin used in the present disclosure is not particularly limited and may include any one or more maleimide resins useful for preparing a prepreg, a resin film, a laminate or a printed circuit board. In some embodiments, the maleimide resin may comprise 4,4'-diphenylmethane bismaleimide, polyphenylmethane maleimide (a.k.a. oligomer of phenylmethane maleimide), bisphenol A diphenyl ether bismaleimide, 3,3'-dimethyl-5,5'-diethyl-4,4'-diphenyl methane bismaleimide (a.k.a. bis-(3-ethyl-5-methyl-4-maleimidephenyl) methane), 3,3'-dimethyl-5,5'-dipropyl-4,4'-diphenylmethane bismaleimide, m-phenylene bismaleimide, 4-methyl-1,3-phenylene bismaleimide, 1,6-bismaleimide-(2,2,4-trimethyl) hexane, N-2,3-xylylmaleimide, N-2,6-xylyl maleimide, N-phenylmaleimide, vinyl benzyl maleimide (VBM), maleimide resin containing aliphatic long chain structure, prepolymer of diallyl compound and maleimide resin, prepolymer of diamine and maleimide resin, prepolymer of multi-functional amine and maleimide resin, prepolymer of acid phenol compound and maleimide resin, or a combination thereof. These components should be construed as including their modifications.

For example, the maleimide resin may include products such as BMI-1000, BMI-1000H, BMI-1100, BMI-1100H, BMI-2000, BMI-2300, BMI-3000, BMI-3000H, BMI-4000, BMI-5000, BMI-5100, BMI-TMH, BMI-7000 and BMI-7000H available from Daiwakasei Industry Co., Ltd., or products such as BMI-70 and BMI-80 available from K.I Chemical Industry Co., Ltd.

For example, the maleimide resin containing aliphatic long-chain structure may include products such as BMI-689, BMI-1400, BMI-1500, BMI-1700, BMI-2500, BMI-3000, BMI-5000 and BMI-6000 available from Designer Molecules Inc.

In addition to the core-shell rubber, the vinyl-containing benzoxazine resin and the maleimide resin, the resin composition disclosed herein may optionally further comprise polyphenylene ether resin, cyanate ester resin, active ester, vinylbenzyl-dicyclopentadiene phenylene ether, bis(vinylbenzyl)ether, 1,2-bis(vinyl phenyl)ethane, divinylbenzene, triallyl isocyanurate, triallyl cyanurate, 1,2,4-trivinyl cyclohexane, diallyl bisphenol A, styrene, acrylate, polyolefin, epoxy resin, phenolic resin, styrene maleic anhydride resin, amine curing agent, polyamide, polyimide, or a combination thereof. These components should be construed as including their modifications.

Unless otherwise specified, relative to 100 parts by weight of the maleimide resin, any resin described above may range from 1 part by weight to 100 parts by weight, and the ratio therebetween can be adjusted according to the need.

embodiments, the vinyl-containing polyphenylene ether may include: vinylbenzyl-terminated polyphenylene ether (e.g., OPE-2st available from Mitsubishi Gas Chemical Co., Inc.), methacrylate-terminated polyphenylene ether (e.g., SA9000 available from Sabic), vinylbenzyl-terminated bisphenol A polyphenylene ether, vinyl-containing chain-extended polyphenylene ether, or a combination thereof. The vinyl-containing chain-extended polyphenylene ether may include various polyphenylene ethers disclosed in the US Patent Publication No. 2016/0185904 A1, all of which are incorporated herein by reference in their entirety.

The cyanate ester resin suitable for the present disclosure is not particularly limited and may be any compound with an Ar—O—C≡N structure, wherein Ar represents a substituted or unsubstituted aromatic group. Examples include but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin, fluorene cyanate ester resin, or a combination thereof. The novolac cyanate ester resin may comprise bisphenol A novolac cyanate ester resin, bisphenol F novolac cyanate ester resin, phenol novolac cyanate ester resin or a combination thereof. For example, the cyanate ester resin may be available under the tradename primaset PT-15, PT-30S, PT-60S, BA-200, BA-230S, BA-3000S, BTP-2500, BTP-6020S, DT-4000, DT-7000, ULL-950S, HTL-300, CE-320, LUT-50 or LeCy sold by Lonza.

The active ester suitable for the present disclosure may be any active polyester resins known in the field to which this disclosure pertains, including but not limited to various commercially available active polyester resin products. Examples include, but not limited to, active polyester resin products HPC-8000 and HPC-8150 available from D.I.C. Corporation.

For example, the vinylbenzyl-dicyclopentadiene phenylene ether is not particularly limited and may comprise but not limited to a structure of Formula (9):

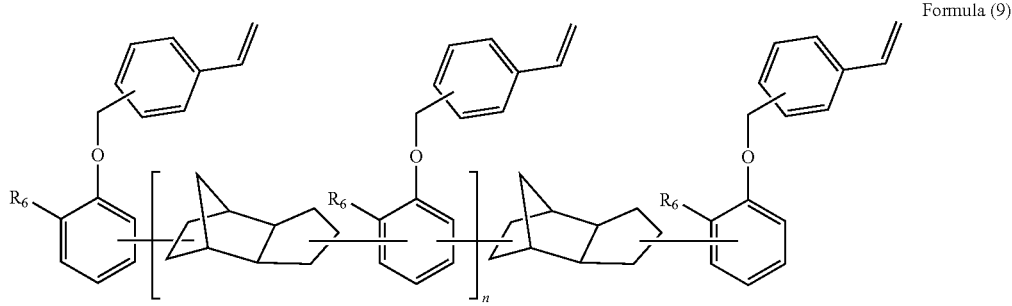

Formula (9)

For example, the polyphenylene ether (a.k.a. polyphenylene oxide) resin used herein is not particularly limited and may comprise various polyphenylene ether resins known in the art to which this disclosure pertains, such as but not limited to a hydroxyl-terminated polyphenylene ether, a vinyl-containing polyphenylene ether, or a combination thereof. Preferably, the polyphenylene ether resin comprises a vinyl-containing polyphenylene ether. The vinyl-containing polyphenylene ether suitable for the present disclosure is not particularly limited and may comprise any one or more commercially available products, self-prepared products, or a combination thereof. In some wherein each $R_6$ independently represents hydrogen, a $C_1$-$C_{20}$ straight chain alkyl group, a $C_1$-$C_{20}$ cycloalkyl group or a $C_1$-$C_{20}$ aryl group; and n is an integer of 1 to 10; preferably, $R_6$ is hydrogen or methyl group and n is an integer of 1 to 3.

The bis(vinylbenzyl)ether, 1,2-bis(vinylphenyl)ethane, divinylbenzene, triallyl isocyanurate, triallyl cyanurate, 1,2, 4-trivinyl cyclohexane, diallyl bisphenol A and styrene suitable for the present disclosure are not particularly limited and may comprise various commercially available products.

The acrylate suitable for the present disclosure is not particularly limited, examples including the acrylate compound comprising two or more unsaturated bonds per molecule described above and various commercially available mono-functional acrylates.

The polyolefin suitable for the present disclosure is not particularly limited and may comprise any one or more commercially available products, self-prepared products or a combination thereof. Examples include but are not limited to styrene-butadiene-divinylbenzene terpolymer, hydrogenated styrene-butadiene-divinylbenzene terpolymer, styrene-butadiene-maleic anhydride terpolymer, hydrogenated styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, maleic anhydride-butadiene copolymer, polybutadiene (i.e., homopolymer of butadiene), or a combination thereof.

The epoxy resin suitable for the present disclosure may be any epoxy resins known in the field to which this disclosure pertains, including but not limited to bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin. The phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may comprise DOPO-containing phenol novolac epoxy resin, DOPO-containing cresol novolac epoxy resin, DOPO-containing bisphenol-A novolac epoxy resin, or a combination thereof; the DOPO-HQ epoxy resin may comprise DOPO-HQ-containing phenol novolac epoxy resin, DOPO-HQ-containing o-cresol novolac epoxy resin, DOPO-HQ-containing bisphenol-A novolac epoxy resin, or a combination thereof.

The phenolic resin suitable for the present disclosure may comprise, but not limited to, mono-functional, bifunctional or multifunctional phenolic resin, comprising phenolic resin of a resin composition conventionally useful for making prepregs, such as phenoxy resin, phenol novolac resin, etc.

For example, in the styrene maleic anhydride resin, the ratio of styrene (S) to maleic anhydride (MA) may be for example 1:1, 2:1, 3:1, 4:1, 6:1, 8:1 or 12:1, examples including styrene maleic anhydride resins such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope, but not limited thereto.

The amine curing agent suitable for the present disclosure may include, but not limited to, diamino diphenyl sulfone, diamino diphenyl methane, diamino diphenyl ether, diamino diphenyl sulfide, dicyandiamide, or a combination of.

The polyamide suitable for the present disclosure may be any polyamide resins known in the field to which this disclosure pertains, including but not limited to various commercially available polyamide resin products.

The polyimide suitable for the present disclosure may be any polyimide resins known in the field to which this disclosure pertains, including but not limited to various commercially available polyimide resin products.

Moreover, in addition to the aforesaid components, the resin composition disclosed herein may optionally further comprise flame retardant, inorganic filler, curing accelerator, polymerization inhibitor, solvent, silane coupling agent, surfactant, coloring agent, toughening agent or a combination thereof.

The flame retardant suitable for the present disclosure may be any one or more flame retardants useful for preparing a prepreg, a resin film, a laminate or a printed circuit board, examples including but not limited to phosphorus-containing flame retardant, preferably comprising: ammonium polyphosphate, hydroquinone bis-(diphenyl phosphate), bisphenol A bis-(diphenylphosphate), tri(2-carboxyethyl) phosphine (TCEP), phosphoric acid tris (chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives (such as di-DOPO compounds) or resins, DPPO (diphenylphosphine oxide) and its derivatives (such as di-DPPO compounds) or resins, melamine cyanurate, tri-hydroxy ethyl isocyanurate, aluminium phosphinate (e.g., commercially available OP-930 and OP-935) or a combination thereof.

For example, the flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN), and a DOPO-containing epoxy resin, wherein DOPO-PN is a DOPO-containing phenol novolac resin, and DOPO-BPN may be a DOPO-containing bisphenol novolac resin, such as DOPO-BPAN (DOPO-bisphenol A novolac), DOPO-BPFN (DOPO-bisphenol F novolac) and DOPO-BPSN (DOPO-bisphenol S novolac).

Unless otherwise specified, relative to 100 parts by weight of the maleimide resin, the amount of flame retardant used in the present disclosure is not particularly limited and may be 1 to 100 parts by weight.

The inorganic filler suitable for the present disclosure may be any one or more inorganic fillers useful for preparing a prepreg, a resin film, a laminate or a printed circuit board, examples including but not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Moreover, the inorganic filler can be spherical, fibrous, plate-like, particulate, sheet-like or whisker-like and can be optionally pre-treated by a silane coupling agent.

Unless otherwise specified, relative to 100 parts by weight of the maleimide resin, the amount of inorganic filler used in the present disclosure is not particularly limited and may be 10 to 300 parts by weight.

The curing accelerator suitable for the present disclosure may comprise a catalyst, such as a Lewis base or a Lewis acid. The Lewis base may comprise imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP) or a combination thereof. The Lewis acid may comprise metal salt compounds, such as those of manganese, iron, cobalt, nickel, copper and zinc, such as zinc octanoate or cobalt octanoate. The curing accelerator encompasses curing initiator such as a peroxide capable of producing free radicals, and examples of the curing initiator may comprise, but not limited to: dibenzoyl peroxide (BPO), dicumyl peroxide, 2,5-dimethyl-2,5-di(t-butylperoxy)hexane, 2,5-dimethyl-2, 5-di(t-butylperoxy)-3-hexyne (25B), di-t-butyl peroxide, di(t-butylperoxyisopropyl)benzene, di(t-butylperoxy) phthalate, di(t-butylperoxy)isophthalate, t-butyl peroxybenzoate, 2,2-di(t-butylperoxy)butane, 2,2-di(t-butylperoxy)octane, 2,5-dimethyl-2,5-di(benzoyl peroxy)hexane, lauroyl peroxide, t-hexyl peroxypivalate, dibutylperoxyisopropyl benzene, bis(4-t-butylcyclohexyl) peroxydicarbonate or a combination thereof.

Unless otherwise specified, in the present disclosure, the amount of curing accelerator may be adjusted according to the need; for example, but not limited thereto, relative to 100 parts by weight of the maleimide resin, the amount of curing accelerator may be 0.1 to 5.0 parts by weight and preferably 0.85 to 0.90 part by weight.

As used herein, the polymerization inhibitor is used to inhibit the polymerization reaction, and examples thereof are not particularly limited, which may include various molecule type polymerization inhibitors, mediated radical type polymerization inhibitors or a combination thereof known in the field to which this disclosure pertains. For example, molecule type polymerization inhibitors suitable for the present disclosure include but are not limited to phenols, quinones, arylamines, arene nitro compounds, sulfur-containing compounds, chlorides of metal with variable valency or a combination thereof more specifically, molecule type polymerization inhibitors suitable for the present disclosure include but are not limited to phenol, hydroquinone, 4-tert-butylcatechol, benzoquinone, chloroquinone, 1,4-naphthoquinone, trimethylquinone, aniline, nitrobenzene, $Na_2S$, $FeCl_3$, $CuCl_2$ or a combination thereof. For example, mediated radical type polymerization inhibitors suitable for the present disclosure include but are not limited to 1,1-diphenyl-2-picrylhydrazyl radical (DPPH), triphenylmethyl radical or a combination thereof.

The purpose of adding solvent according to the present disclosure is to dissolve the components in the resin composition so as to change the solid content of the resin composition and to adjust the viscosity of the resin composition. For example, the solvent may comprise, but not limited to, methanol, ethanol, ethylene glycol monomethyl ether, acetone, butanone (i.e., methyl ethyl ketone), methyl isobutyl ketone, cyclohexanone, toluene, xylene, methoxyethyl acetate, ethoxyethyl acetate, propoxyethyl acetate, ethyl acetate, propylene glycol methyl ether, dimethyl formamide, dimethyl acetamide, N-methyl-pyrrolidone, or a mixture thereof.

Silane coupling agent suitable for the present disclosure may comprise silane (such as but not limited to siloxane), which may be further categorized according to the functional groups into amino silane, epoxide silane, vinyl silane, ester silane, hydroxyl silane, isocyanate silane, methacryloxy silane and acryloxy silane.

The purpose of surfactant used herein is to ensure uniform distribution of the inorganic filler in the resin composition.

The coloring agent (i.e., staining agent) suitable for the present disclosure may comprise, but not limited to, dye or pigment.

The purpose of toughening agent used herein is to improve the toughness of the resin composition. The toughening agent may comprise, but not limited to, carboxyl-terminated butadiene acrylonitrile rubber (CTBN rubber).

The resin compositions of various embodiments of the present disclosure may be processed by various methods into different articles, including but not limited to a prepreg, a resin film, a laminate or a printed circuit board.

For example, the resin compositions of various embodiments may be used to make prepregs.

In one embodiment, the prepreg disclosed herein has a reinforcement material and a layered structure formed thereon, wherein the layered structure is made by heating the resin composition at high temperature to a semi-cured state (B-stage). Suitable baking temperature for making the prepreg may be for example 120° C. to 180° C. The reinforcement material may be any one of a fiber material, woven fabric, and non-woven fabric, and the woven fabric preferably comprises fiberglass fabrics. Types of fiberglass fabrics are not particularly limited and may be any commercial fiberglass fabric useful for various printed circuit boards, such as E-glass fiber fabric, D-glass fiber fabric, S-glass fiber fabric, T-glass fiber fabric, L-glass fiber fabric or Q-glass fiber fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

In one embodiment, by well mixing the resin composition to form a varnish, loading the varnish into an impregnation tank, impregnating a fiberglass fabric into the impregnation tank to adhere the resin composition onto the fiberglass fabric, and proceeding with heating and baking at a proper temperature to a semi-cured state, a prepreg may be obtained.

For example, the article made from the resin composition disclosed herein may be a resin film which is prepared by heating and baking the resin composition to the semi-cured state. For example, by selectively coating the resin composition on a liquid crystal polymer film, a polyethylene terephthalate film (PET film) or a polyimide film, followed by heating and baking at a proper temperature to a semi-cured state, a resin film may be obtained. For example, the resin composition from each embodiment may be coated on a copper foil to uniformly adhere the resin composition thereon, followed by heating and baking at a proper temperature to a semi-cured state to obtain the resin film.

For example, the resin composition of the present disclosure may be made into a laminate, which comprises at least two metal foils and an insulation layer disposed between the metal foils, wherein the insulation layer is made by curing the resin composition at high temperature and high pressure to the C-stage, a suitable curing temperature being for example between 190° C. to 220° C. and preferably between 200° C. to 210° C. and a suitable curing time being 90 to 180 minutes and preferably 120 to 150 minutes. The insulation layer may be obtained by curing the aforesaid prepreg or resin film. The metal foil may contain copper, aluminum, nickel, platinum, silver, gold or alloy thereof, such as a copper foil. In a preferred embodiment, the laminate is a copper-clad laminate.

In one embodiment, the laminate may be further processed by trace formation processes to obtain a printed circuit board.

For example, a double-sided copper-clad laminate (such as product EM-827, available from Elite Material Co., Ltd.) with a thickness of 28 mil and having a 1 ounce (oz) HTE (high temperature elongation) copper foil may be used and subject to drilling and then electroplating, so as to form electrical conduction between the upper layer copper foil and the bottom layer copper foil. Then the upper layer copper foil and the bottom layer copper foil are etched to form inner layer circuits. Then brown oxidation and roughening were performed on the inner layer circuits to form uneven structures on the surface to increase roughness. Next, a vacuum lamination apparatus is used to laminate the assembly containing a copper foil, the prepreg, the inner layer circuit board, the prepreg and a copper foil stacked in said order by heating at 190 to 220° C. for 90 to 180 minutes to cure the insulation material of the prepregs. Next, black oxidation, drilling, copper plating and other known circuit board processes are performed on the outmost copper foils so as to obtain the printed circuit board.

In one or more embodiments, the resin composition of the present disclosure and various articles made therefrom may preferably have any one, more or all of the following properties.

In one embodiment, a dissipation factor at 10 GHz as measured by reference to JIS C2565 is less than or equal to 0.0072, such as between 0.0052 and 0.0072.

In one embodiment, a copper foil (3 μm copper foil) peeling strength as measured by using a tensile strength tester by reference to IPC-TM-650 2.4.8 is greater than or equal to 5.5 lb/in, such as greater than or equal to 5.6 lb/in, such as between 5.6 lb/in and 5.9 lb/in.

In one embodiment, a ten-layer board T300 thermal resistance as measured by reference to IPC-TM-650 2.4.24.1 is greater than 130 minutes, such as between 130 and 140 minutes.

In one embodiment, a ten-layer board glass transition temperature as measured by using a dynamic mechanical analyzer by reference to IPC-TM-650 2.4.24.4 is greater than or equal to 320° C., such as between 320° C. and 325° C.

In one embodiment, a ten-layer board delamination temperature as measured by using a dynamic mechanical analyzer by reference to IPC-TM-650 2.4.24.4 is greater than or equal to 350° C., such as between 350° C. and 357° C.

In one embodiment, an inner resin flow as measured from a lamination resin flow test is greater than or equal to 6.0 mm, such as between 6.0 mm and 7.2 mm.

In one embodiment, the article is absent of branch-like pattern and void in an open area as observed from a resin filling property test of the open area.

Raw materials below were used to prepare the resin compositions of various Examples (Table 1 and Table 2) and Comparative Examples (Table 3) of the present disclosure and further fabricated to prepare test samples or articles.

The names of chemicals used in the Examples and Comparative Examples are as follows:
1. core-shell rubbers A1 to A6: prepared by the Applicant.
2. polyphenylmethane maleimide: BMI-2300, purchased from Daiwakasei Industry Co., Ltd.
3. 3,3'-dimethyl-5,5'-diethyl-4,4'-diphenylmethane bismaleimide: BMI-70, purchased from K.I Chemical Industry Co., Ltd.
4. maleimide resin containing aliphatic long chain structure: BMI-3000, purchased from Designer Molecules Inc.
5. prepolymer of polybutadiene and benzoxazine resin: prepared by the Applicant.
6. allyl-containing bisphenol A benzoxazine resin: prepared by the Applicant or purchased from Kolon.
7. allyl-containing dicyclopentadiene benzoxazine resin: prepared by the Applicant or purchased from Kolon.
8. oxydianiline benzoxazine resin: PF-3500, purchased from Chang Chun Plastics.
9. bisphenol A benzoxazine resin: LZ 8290, purchased from Huntsman Corporation.
10. dicyclopentadiene benzoxazine resin: DCPD-Bz, prepared by the Applicant or purchased from Kolon.
11. methacrylate-terminated polyphenylene ether: SA9000, purchased from Sabic.
12. cyanate ester resin: BA-230S, purchased from Lonza.
13. active ester: HPC 8000, purchased from DIC Corporation.
14. inorganic filler: spherical silica, SC2500-SVJ, purchased from Admatechs.
15. curing accelerator: 2-ethyl-4-methylimidazole, 2E4MI, purchased from Shikoku Chemicals Corp.
16. solvent: methyl ethyl ketone (MEK), purchased from Sinopec Group.

Components prepared by the Applicant used in the Examples and the Comparative Examples correspond to the products obtained from Preparation Example 1 to Preparation Example 10.

Preparation Example 1: Preparation of Core-Shell Rubber A1

To a four-necked flask, styrene-butadiene rubber (SBR, purchased from Zibo Qilong Chemical Industry Co., Ltd., Shandong Province) was added and stirred continuously, followed by the addition of K2S208 and disproportionate rosin soap emulsifier, and heated in water bath to 75° C.; methyl methacrylate monomer (MMA, purchased from Tianjin Chemical Reagent Research Institute) was slowly added through a dropping funnel to the four-necked flask, wherein the mass of SBR and MMA added was controlled at a ratio of 9.5:0.5, and the reaction was performed at this temperature for four hours; after that, the copolymer solution was condensed, washed, filtered and spray-dried to obtain core-shell rubber nanoparticles containing styrene-butadiene rubber as the core and poly(methyl methacrylate) as the shell and having a core-shell ratio of 9.5:0.5.

Preparation Example 2: Preparation of Core-Shell Rubber A2

The same processes described in Preparation Example 1 were used except that the mass ratio of SBR to MMA was 8.0:2.0, from which core-shell rubber nanoparticles were obtained containing styrene-butadiene rubber as the core and poly(methyl methacrylate) as the shell and having a core-shell ratio of 8.0:2.0.

Preparation Example 3: Preparation of Core-Shell Rubber A3

The same processes described in Preparation Example 1 were used except that the mass ratio of SBR to MMA was 6.0:4.0, from which core-shell rubber nanoparticles were obtained containing styrene-butadiene rubber as the core and poly(methyl methacrylate) as the shell and having a core-shell ratio of 6.0:4.0.

Preparation Example 4: Preparation of Core-Shell Rubber A4

The same processes described in Preparation Example 2 were used except that SBR was replaced by the same amount of polybutadiene (B-1000, purchased from Nippon Soda), from which core-shell rubber nanoparticles were obtained containing polybutadiene as the core and poly(methyl methacrylate) as the shell and having a core-shell ratio of 8.0:2.0.

Preparation Example 5: Preparation of Core-Shell Rubber A5

The same processes described in Preparation Example 2 were used except that SBR was replaced by the same amount of polydimethylsiloxane (dimethyl silicone, purchased from Macklin), from which core-shell rubber nanoparticles were obtained containing polydimethylsiloxane as the core and poly(methyl methacrylate) as the shell and having a core-shell ratio of 8.0:2.0.

Preparation Example 6: Preparation of Core-Shell Rubber A6

The same processes described in Preparation Example 1 were used except that the mass ratio of SBR to MMA was 5.0:5.0, from which core-shell rubber nanoparticles were obtained containing styrene-butadiene rubber as the core and poly(methyl methacrylate) as the shell and having a core-shell ratio of 5.0:5.0.

Preparation Example 7: Preparation of Prepolymer of Polybutadiene and Benzoxazine Resin To a reactor, 15 grams of bisphenol A benzoxazine resin and 0.229 gram of aluminum chloride were added and dispersed in a dichloromethane solvent, the temperature was controlled at 50° C.-60° C., and the reaction was stirred for 1-2 hours to induce ring opening of the bisphenol A benzoxazine resin; then 5 grams of polybutadiene and 0.04 gram of 1-methyl-3-n-butylimidazolium fluoroborate were added and reacted under a pressure of 0.5-0.8 Mpa and a temperature of 70-100° C. for three hours, followed by cooling and purification to obtain the prepolymer of polybutadiene and benzoxazine resin having a structure as shown in Formula (1), wherein m is an integer of 1 to 10.

Preparation Example 8: Preparation of Allyl-Containing Bisphenol A Benzoxazine Resin At ambient temperature, 228 grams (0.4 mole) of allylamine and 228 grams (0.1 mole) of bisphenol A were added to a reaction tank, followed by adding 240 grams (0.8 mole, concentration of 10%) of formaldehyde solution and then heating to 90° C. to 100° C. to proceed the reaction for 3-6 hours. After the reaction was completed, water was removed and the system was heated to 110-130° C. until it became clear and transparent, thereby obtaining the allyl-containing bisphenol A benzoxazine resin having a structure as shown in Formula (5), wherein a is 3 and $R_1$ is hydrogen.

Preparation Example 9: Preparation of Allyl-Containing Dicyclopentadiene Benzoxazine Resin (Allyl-Containing DCPD-Bz)

At ambient temperature, 228 grams (0.4 mole) of allylamine and 80 grams (0.1 mole) of dicyclopentadiene phenol (PD-9110, purchased from Chang Chun Plastics, number average molecular weight Mn=800 g/mol) were added to a reaction tank, followed by adding 240 grams (0.8 mole, concentration of 10%) of formaldehyde solution and then heating to 90° C. to 100° C. to proceed the reaction for 3-6 hours. After the reaction was completed, water was removed and the system was heated to 110-130° C. until it became clear and transparent, thereby obtaining the allyl-containing dicyclopentadiene benzoxazine resin having a structure as shown in Formula (7), wherein q is an integer of 1 to 10, a is 3, b is 1, c is 3, $R_1$ is hydrogen, $R_2$ is hydroxyl group, and $R_3$ is hydrogen.

Preparation Example 10: Preparation of Dicyclopentadiene Benzoxazine Resin (DCPD-Bz)

At ambient temperature, 372 grams (0.4 mole) of aniline and 80 grams (0.1 mole) of dicyclopentadiene phenol (PD-9110, purchased from Chang Chun Plastics, number average molecular weight Mn=800 g/mol) were added to a reaction tank, followed by adding 240 grams (0.8 mole, concentration of 10%) of formaldehyde solution and then heating to 90° C. to 100° C. to proceed the reaction for 3-6 hours. After the reaction was completed, water was removed and the system was heated to 110-130° C. until it became clear and transparent, thereby obtaining the dicyclopentadiene benzoxazine resin.

For the property tests of Examples E1 to E12 and Comparative Examples C1 to C8 listed in Tables 4 to Table 6, samples (specimens) were prepared as described below and tested under specified conditions as follows.

1. Prepreg: Resin composition from each Example (Tables 1-2) or each Comparative Example (Table 3) was individually well-mixed to form a varnish, which was then loaded to an impregnation tank; a fiberglass fabric (e.g., 7628 E-glass fiber fabric, 2116 E-glass fiber fabric, 1080 E-glass fiber fabric, 1078 E-glass fiber fabric or 1027 E-glass fiber fabric, all available from Asahi) was impregnated into the impregnation tank to adhere the resin composition onto the fiberglass fabric, followed by heating at 150° C. to 170° C. to B-stage to obtain a prepreg.
2. Copper-free laminate (2-ply, formed by lamination of two prepregs): Two 18 μm HTE (high temperature elongation) copper foils and two prepregs obtained from 2116 E-glass fiber fabrics impregnated with each Example or Comparative Example were prepared and stacked in the order of one copper foil, two prepregs and one copper foil, followed by lamination under vacuum at 420 psi and 200° C. for 2 hours to form a copper-clad laminate (2-ply, formed by lamination of two prepregs). Next, each copper-clad laminate was etched to remove the copper foils on both sides to obtain a copper-free laminate (2-ply) which is formed by laminating two prepregs and has a resin content of about 55%.
3. Four-layer circuit board comprising ultra-thin copper foil: Four prepregs obtained from 7628 E-glass fiber fabrics impregnated with each Example or Comparative Example and having a resin content of about 42% were prepared and stacked, and both sides of the stack were respectively covered with a copper foil, followed by lamination under vacuum at high temperature (200° C.) and high pressure (420 psi) for 2 hours to form a copper-clad laminate. Then the copper-clad laminate was subject to a brown oxidation process to obtain a brown oxide treated copper-clad laminate. Two prepregs, which were made using 2116 E-glass fiber fabrics impregnated with the resin composition of the same Example or the same Comparative Example and had a resin content of about 55%, were respectively covered on both sides of the brown oxide treated copper-clad laminate; next, a 3 μm ultra-thin copper foil (MTHD18-V2) was covered on the outer sides of the two prepregs, and then the ultra-thin copper foil (with the copper foil surface adhered to the prepreg and the carrier layer away from the prepreg), a prepreg, the brown oxide treated copper-clad laminate, a prepreg and the ultra-thin copper foil were superimposed in said order, followed by lamination for 2 hours in vacuum at 200° C. to obtain an ultra-thin copper-containing laminate. Carrier copper on the ultra-thin copper surface of the ultra-thin copper-containing laminate was peeled off, and electroplating of the whole plate was performed without the cleaning process, such that the copper layer has a thickness of 35 μm to form a four-layer circuit board comprising ultra-thin copper foil.

4. Ten-layer board comprising copper foil: First, a core was prepared as follows: a prepreg (resin content of about 55%) prepared from each Example or each Comparative Example impregnated with a 2116 E-glass fiber fabric was superimposed on both sides with a piece of 18 μm RTF copper foil (reverse treated copper foil), followed by lamination and curing for 2 hours under vacuum at high temperature (200° C.) and high pressure (420 psi) to obtain a copper-clad core. Then the copper-clad core obtained above was etched to remove the two copper foils so as to obtain a copper-free core, and four copper-free cores were prepared using the method described above. Next, two 18 μm RTF copper foils and ten prepregs obtained from 2116 E-glass fiber fabrics impregnated with each Example or Comparative Example were prepared and stacked in the order of one copper foil, two prepregs, one copper-free core, two prepregs, one copper-free core, two prepregs, one copper-free core, two prepregs, one copper-free core, two prepregs, and one copper foil, followed by lamination under vacuum at 420 psi and 200° C. for 2 hours to form a copper-clad ten-layer board.

5. Copper-free ten-layer board: Each copper-clad ten-layer board obtained above was etched to remove the copper foils at both sides so as to obtain the copper-free ten-layer board.

Each sample was analyzed as described below.

Dissipation Factor (Df)

In the dissipation factor measurement, the copper-free laminate (2-ply) was tested by using a microwave dielectrometer available from AET Corp. by reference to JIS C2565 "Measuring methods for ferrite cores for microwave device" at 10 GHz for analyzing each specimen. Lower dissipation factor represents better dielectric properties of the sample. A difference in Df of less than 0.0005 represents no substantial difference in dissipation factor of different laminates, and a difference in Df of greater than or equal to 0.0005 represents a substantial difference in dissipation factor of different laminates.

Copper Foil (3 μm Copper Foil) Peeling Strength (Peeling Strength, P/S) The four-layer circuit board comprising ultra-thin copper foil was cut into a rectangular sample with a width of 24 mm and a length of greater than 60 mm, which was etched to remove surface copper foil and leave a rectangular copper foil with a width of 3.18 mm and a length of greater than 60 mm to be tested by using a tensile strength tester by reference to IPC-TM-650 2.4.8 at room temperature (about 25° C.) to measure the force (1b/in) required to separate the copper foil from the insulation layer of the laminate.

Ten-Layer Board T300 Thermal Resistance

The aforesaid ten-layer board comprising copper foil was used as the specimen and subject to the ten-layer board T300 thermal resistance test. At a constant temperature of 300° C., a thermomechanical analyzer (TMA) was used by reference to IPC-TM-650 2.4.24.1 "Time to Delamination (TMA Method)" to measure each specimen and record the time to delamination. If no delamination was observed after 130 minutes of heating, a designation of ">130" was given.

Ten-Layer Board Glass Transition Temperature (Tg)

The copper-free ten-layer board specimen was subject to glass transition temperature measurement. A dynamic mechanical analyzer (DMA) was used by reference to IPC-TM-650 2.4.24.4 "Glass Transition and Modulus of Materials Used in High Density Interconnection (HDI) and Microvias-DMA Method" to measure the glass transition temperature (° C.) of each specimen. Temperature interval during the measurement was set at 50-400° C. with a temperature increase rate of 2° C./minute; higher glass transition temperature is more preferred.

Ten-Layer Board Delamination Temperature

Figure 4:
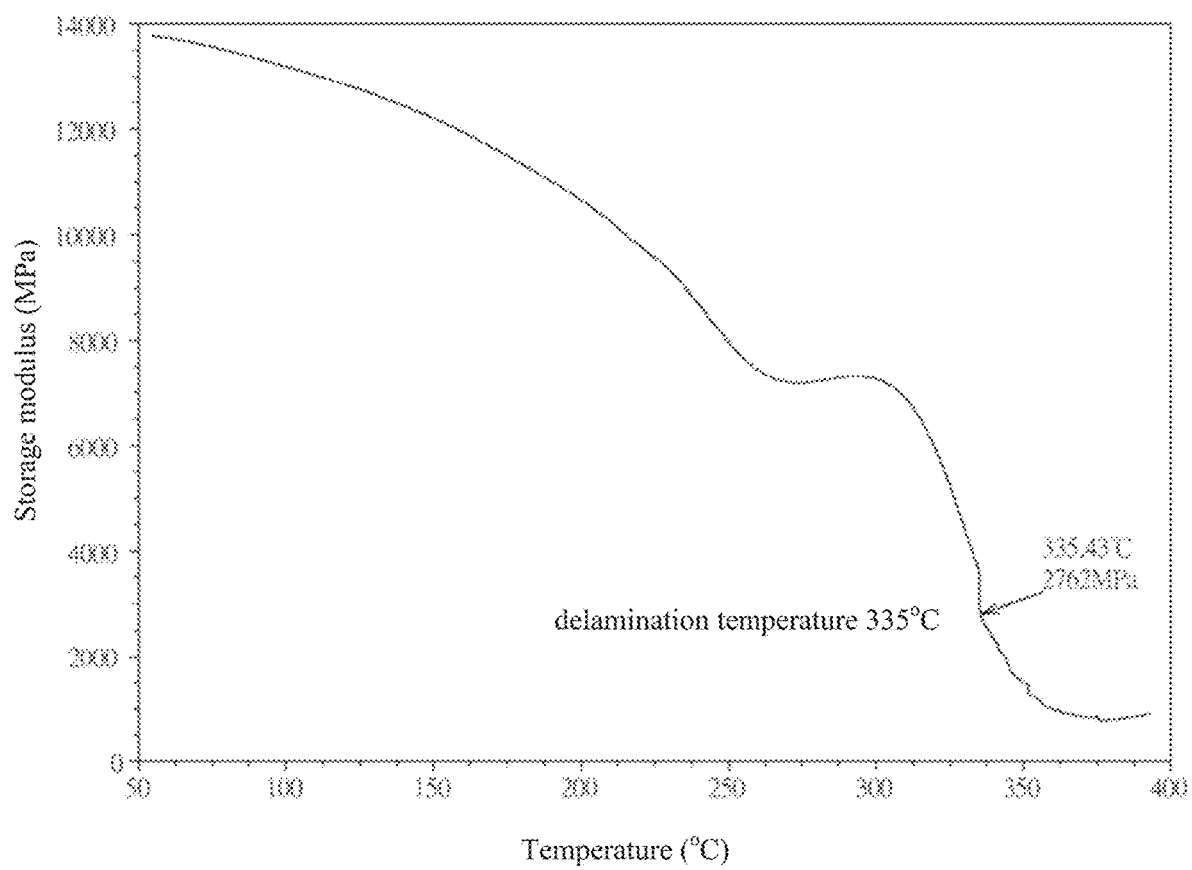
FIG. 4 illustrates the curve of a ten-layer board delamination temperature test.

The copper-free ten-layer board specimen was subject to ten-layer board delamination temperature measurement. A dynamic mechanical analyzer (DMA) was used by reference to IPC-TM-650 2.4.24.4 "Glass Transition and Modulus of Materials Used in High Density Interconnection (HDI) and Microvias-DMA Method" to measure the modulus of each specimen. After the glass transition temperature where slightly linear decrease in the curve of storage modulus is observed, as illustrated in FIG. 4, the temperature corresponding to the point was recorded as the delamination temperature (° C.). Temperature interval during the measurement was set at 50-400° C. with a temperature increase rate of 2° C./minute; higher delamination temperature is more preferred.

Inner Resin Flow

One prepreg (resin content of about 65%) obtained from 1080 E-glass fiber fabric impregnated with the resin composition from each Example or Comparative Example was prepared and then punched at a predetermined position with a rhombus punching machine to form a 4 inch*4 inch rhombus opening and provide a punched prepreg. A double-sided copper-clad laminate (such as product name EM-827, available from Elite Material Co., Ltd.) with a thickness of 15 mil and having 1-ounce HTE (high temperature elongation) copper foils was prepared and then stacked in the order of EM-827 double-sided copper-clad laminate, a punched prepreg and a copper foil (18 μm HTE copper foil, with the smooth side facing the prepreg), and then the stack was subject to lamination and curing for 2 hours at high temperature (200° C.) and high pressure (420 psi) under vacuum, followed by removing the copper foil on the prepreg surface. During the measurement, a 4 inch*4 inch rhombus was marked at the edge of the glass fabric by visual observation and reference lines were drew with pencil and ruler; each side was divided into 4 equal sections, and three data were measured for each side representing the distance between the point with maximum resin flow and the reference lines, such that a total of 12 data were collected; following the processes above, the other three rhombuses were subject to measurement to provide a total of 48 data. The average of the 48 data was calculated to represent the inner resin flow. Higher inner resin flow indicates better flowability.

Resin Filling Property in Open Area

First, a core was prepared as follows: a prepreg (using 1078 E-glass fiber fabric, resin content of about 64%) prepared from each Example (E1 to E12) or each Comparative Example (C1 to C8) was superimposed on both sides with a piece of 18 μm HTE copper foil, followed by lamination and curing for 2 hours under vacuum at high temperature (200° C.) and high pressure (420 psi) to obtain a copper-clad core.

The copper-clad core was subject to conventional inner layer trace processes according to the Gerber Format Specification. First, the copper-clad core was treated by surface roughening on the copper foils by grinding and micro-etching, and then a photoresist dry film was tightly attached to the copper-clad core with proper temperature and pressure conditions. The core attached with the photoresist dry film was exposed in a UV exposure machine, during which the photoresist performed polymerization after UV radiation on the transparent area of the artwork (the dry film at the area was preserved as etching resist in the subsequent development and copper etching steps), so as to transfer the trace image on the artwork to the photoresist dry film. The protective membrane on the film was torn down, and the area not subject to radiation on the film was removed by a sodium bicarbonate solution, followed by etching off the exposed copper foil with a mixture solution of hydrochloric acid and hydrogen peroxide so as to form traces and an open area. Then a sodium hydroxide solution was used to wash off the photoresist dry film to obtain an inner layer wiring board. The inner layer wiring board was subject to a brown oxidation process to obtain a brown oxide treated inner layer wiring board, which had an insulation layer of 2.5 mil in thickness.

Figure 2:
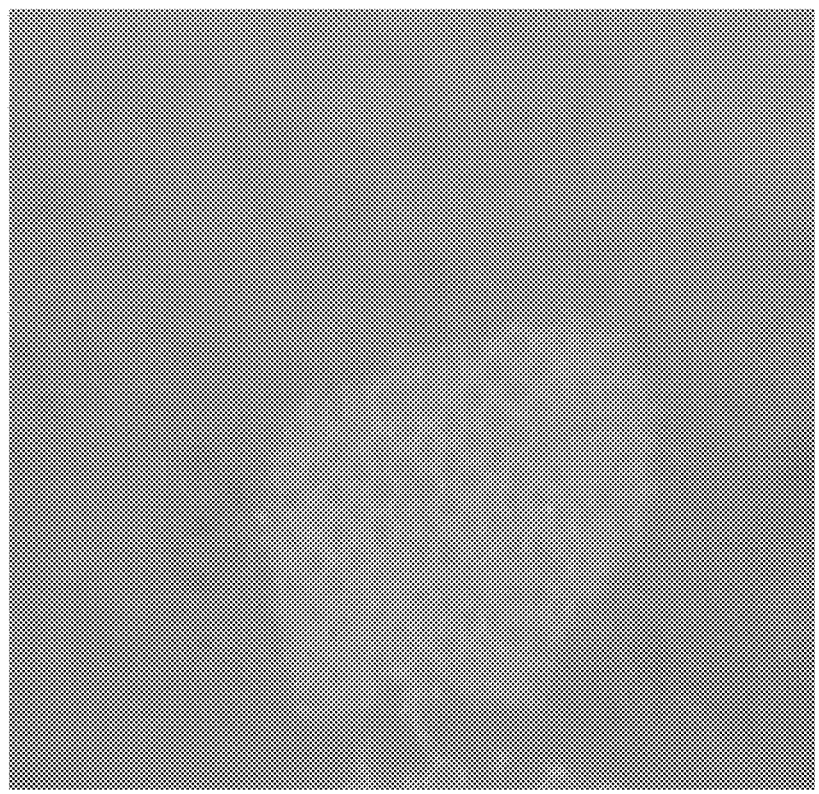
FIG. 2 illustrates the void in the open area.
Figure 3:
FIG. 3 illustrates absence of branch-like pattern and absence of void in the open area.

A prepreg (prepared from each Example E1 to E12 or each Comparative Example C1 to C8 using 1027 E-glass fiber fabric, resin content of about 69%, 1.5 mil in thickness) was superimposed on both sides of the brown oxide treated inner layer wiring board, and the other side of each prepreg opposite to the brown oxide treated inner layer wiring board was covered with a piece of 18 μm HTE copper foil, followed by lamination and curing for 2 hours under vacuum at high temperature (200° C.) and high pressure (420 psi) to obtain a copper-clad multi-layer board. The copper foils on the copper-clad multi-layer board were removed such as by etching to obtain a sample for the resin filling property test of open area. A 10× optical microscope was used to observe the open area of the sample for the resin filling property test of open area to determine the presence or absence of branch-like pattern and void in the open area. A designation "branch-like" is given to represent presence of branch-like pattern (see FIG. 1), a designation "void" is given to represent presence of void (see FIG. 2), and a designation "OK" is given to represent absence of branch-like pattern and absence of void in an open area (see FIG. 3). Presence of branch-like pattern or void in the open area indicates poor resin filling property.

TABLE 1

| Resin compositions of Examples E1 to E6 (in part by weight) | | | | | | | | |
|---|---|---|---|---|---|---|---|---|
| Component | | | E1 | E2 | E3 | E4 | E5 | E6 |
| core-shell rubber | A1 | | | | 5 | | | |
| | A2 | | 5 | 5 | | | | |
| | A3 | | | | | 5 | | |
| | A4 | | | | | | 5 | |
| | A5 | | | | | | | 5 |
| maleimide resin | BMI-2300 | | 100 | 65 | 65 | 65 | 65 | 65 |
| | BMI-70 | | | 35 | 35 | 35 | 35 | 35 |
| | BMI-3000 | | | | | | | |
| vinyl-containing benzoxazine resin | prepolymer of polybutadiene and benzoxazine resin | | 20 | 20 | 20 | 20 | 20 | 20 |
| | allyl-containing bisphenol A benzoxazine resin | | | | | | | |
| | allyl-containing dicyclopentadiene benzoxazine resin | | | | | | | |
| polyphenylene ether resin | SA9000 | | | | | | | |
| cyanate ester resin | BA-230S | | | | | | | |
| active ester | HPC 8000 | | | | | | | |
| inorganic filler | SC2500-SVJ | | 105 | 105 | 105 | 105 | 105 | 105 |
| curing accelerator | 2E4MI | | 0.85 | 0.85 | 0.85 | 0.85 | 0.85 | 0.85 |
| solvent | MEK | | PA | PA | PA | PA | PA | PA |

Note:
"PA" represents "proper amount."

TABLE 2

Resin compositions of Examples E7-E12 (in part by weight)

| | Component | E7 | E8 | E9 | E10 | E11 | E12 |
|---|---|---|---|---|---|---|---|
| core-shell rubber | A1 | | | | | | 2 |
| | A2 | 1 | 15 | 5 | 5 | 5 | 5 |
| | A3 | | | | | | 3 |
| | A4 | | | | | | |
| | A5 | | | | | | |
| maleimide resin | BMI-2300 | 65 | 65 | 65 | 65 | 65 | 75 |
| | BMI-70 | 35 | 35 | 35 | 35 | 35 | 20 |
| | BMI-3000 | | | | | | 5 |
| vinyl-containing benzoxazine resin | prepolymer of polybutadiene and benzoxazine resin | 20 | 20 | 5 | 35 | 10 | 15 |
| | allyl-containing bisphenol A benzoxazine resin | | | | | 5 | 5 |
| | allyl-containing dicyclopentadiene benzoxazine resin | | | | | 5 | 5 |
| polyphenylene ether resin | SA9000 | | | | | | 5 |
| cyanate ester resin | BA-230S | | | | | | 5 |
| active ester | HPC 8000 | | | | | | 10 |
| inorganic filler | SC2500-SVJ | 105 | 105 | 105 | 105 | 105 | 110 |
| curing accelerator | 2E4MI | 0.85 | 0.85 | 0.85 | 0.85 | 0.85 | 0.90 |
| solvent | MEK | PA | PA | PA | PA | PA | PA |

TABLE 3

Resin compositions of Comparative Examples C1 to C8 (in part by weight)

| | Component | C1 | C2 | C3 | C4 | C5 | C6 | C7 | C8 |
|---|---|---|---|---|---|---|---|---|---|
| core-shell rubber | A1 | | | | 20 | | | | |
| | A2 | | | | | 5 | 5 | 5 | 5 | 5 |
| | A3 | | | | | | | | |
| | A6 | | 5 | | | | | | |
| maleimide resin | BMI-2300 | 65 | 65 | 65 | 65 | 65 | 65 | 65 | 65 |
| | BMI-70 | 35 | 35 | 35 | 35 | 35 | 35 | 35 | 35 |
| | BMI-3000 | | | | | | | | |
| vinyl-containing benzoxazine resin | prepolymer of polybutadiene and benzoxazine resin | 20 | 20 | 20 | | 40 | | | |
| | allyl-containing bisphenol A benzoxazine resin | | | | | | | | |
| | allyl-containing dicyclopentadiene benzoxazine resin | | | | | | | | |
| other benzoxazine resin | PF-3500 | | | | | | 20 | | |
| | LZ 8290 | | | | | | | 20 | |
| | DCPD-Bz | | | | | | | | 20 |
| inorganic filler | SC2500-SVJ | 105 | 105 | 105 | 105 | 105 | 105 | 105 | 105 |
| curing accelerator | 2E4MI | 0.85 | 0.85 | 0.85 | 0.85 | 0.85 | 0.85 | 0.85 | 0.85 |
| solvent | MEK | PA | PA | PA | PA | PA | PA | PA | PA |

TABLE 4

Test results of articles made from resin compositions of Examples E1 to E6

| Item | Unit | E1 | E2 | E3 | E4 | E5 | E6 |
|---|---|---|---|---|---|---|---|
| Df | / | 0.0070 | 0.0068 | 0.0067 | 0.0069 | 0.0066 | 0.0068 |
| P/S (3 μm copper foil) | lb/in | 5.8 | 5.7 | 5.6 | 5.8 | 5.8 | 5.8 |
| ten-layer board T300 | min | >130 | >130 | >130 | >130 | >130 | >130 |
| ten-layer board Tg | °C. | 325 | 322 | 322 | 322 | 324 | 325 |
| ten-layer board delamination temperature | °C. | 357 | 352 | 352 | 352 | 353 | 356 |
| inner resin flow | mm | 6.5 | 6.7 | 6.7 | 6.1 | 6.5 | 6.5 |
| resin filling property in open area | / | OK | OK | OK | OK | OK | OK |

TABLE 5

Test results of articles made from resin compositions of Examples E7 to E12

| Item | Unit | E7 | E8 | E9 | E10 | E11 | E12 |
|---|---|---|---|---|---|---|---|
| Df | / | 0.0070 | 0.0064 | 0.0065 | 0.0072 | 0.0067 | 0.0052 |
| P/S (3 μm copper foil) | lb/in | 5.6 | 5.8 | 5.6 | 5.9 | 5.8 | 5.7 |
| ten-layer board T300 | min | >130 | >130 | >130 | >130 | >130 | >130 |
| ten-layer board Tg | °C. | 321 | 320 | 321 | 324 | 322 | 323 |
| ten-layer board delamination temperature | °C. | 350 | 357 | 350 | 357 | 352 | 351 |
| inner resin flow | mm | 7.1 | 6.0 | 6.3 | 7.2 | 6.8 | 6.0 |
| resin filling property in open area | / | OK | OK | OK | OK | OK | OK |

TABLE 6

Test results of resin compositions of Comparative Examples C1 to C8

| Item | Unit | C1 | C2 | C3 | C4 | C5 | C6 | C7 | C8 |
|---|---|---|---|---|---|---|---|---|---|
| Df | / | 0.0072 | 0.0070 | 0.0064 | 0.0065 | 0.0085 | 0.0078 | 0.0078 | 0.0079 |
| P/S (3 μm copper foil) | lb/in | 4.1 | 5.5 | 6.0 | 4.5 | 6.2 | 5.6 | 5.6 | 5.5 |
| ten-layer board T300 | min | >130 | >130 | >130 | >130 | 54 | 80 | 75 | 77 |
| ten-layer board Tg | °C. | 325 | 322 | 318 | 317 | 326 | 322 | 322 | 322 |
| ten-layer board delamination temperature | °C. | 332 | 335 | 357 | 352 | 348 | 352 | 349 | 351 |
| inner resin flow | mm | 7.2 | 4.8 | 2.0 | 4.5 | 7.2 | 5.8 | 5.5 | 5.8 |
| resin filling property in open area | / | branch-like | void | void | OK | OK | branch-like | branch-like | branch-like |

The following observations can be made from Table 1 to Table 6.

Compared with Comparative Example C1 which does not contain a core-shell rubber, Examples E2 and E7 to E8 containing 1 part by weight to 15 parts by weight of the core-shell rubber disclosed herein can significantly improve the ten-layer board delamination temperature and at the same time achieve higher copper foil peeling strength (3 μm copper foil) and absence of branch-like pattern and absence of void in the open area. However, if the amount of core-shell rubber used exceeds beyond the range above (e.g., Comparative Example C3 containing 20 parts by weight of the core-shell rubber), voids will be formed in the open area and the inner resin flow will be greatly decreased.

Compared with Comparative Example C2 which has a core-shell ratio of 5.0:5.0, Examples E2 to E4 having a core-shell ratio of 6.0:4.0 to 9.5:0.5 as disclosed herein can significantly improve the ten-layer board delamination temperature and at the same time achieve higher inner resin flow and absence of branch-like pattern and absence of void in the open area.

Compared with Comparative Example C4 which does not contain a vinyl-containing benzoxazine resin, Examples E2 and E9 to E10 containing 5 parts by weight to 35 parts by weight of the vinyl-containing benzoxazine resin disclosed herein can achieve higher copper foil peeling strength (3 μm copper foil) and higher inner resin flow. In addition, if the amount of the vinyl-containing benzoxazine resin exceeds the aforesaid range (such as Comparative Example C5, containing 40 parts by weight of the vinyl-containing benzoxazine resin), the ten-layer board T300 thermal resistance will be significantly lowered, and the dissipation factor is greatly increased.

Examples E2 and E11, which use a resin composition containing the vinyl-containing benzoxazine resin according to the present disclosure, compared with Comparative Examples which use other benzoxazine resins (such as Comparative Example C6 which uses oxydianiline benzoxazine resin, Comparative Example C7 which uses bisphenol A benzoxazine resin, and Comparative Example C8 which uses dicyclopentadiene benzoxazine resin), achieve higher ten-layer board T300 thermal resistance, lower dissipation factor and absence of branch-like pattern and absence of void in the open area.

Overall, it can be found that articles made from resin compositions comprising 1 part by weight to 15 parts by weight of core-shell rubber, 5 parts by weight to 35 parts by weight of vinyl-containing benzoxazine resin and 100 parts by weight of maleimide resin and characterized by a core-shell ratio of 6.0:4.0 to 9.5:0.5 according to the present disclosure achieve excellent ten-layer board delamination temperature and absence of branch-like pattern and absence of void in the open area and achieve improvements in at least one, more or all of the properties including dissipation factor, copper foil peeling strength (3 μm copper foil), ten-layer board T300 thermal resistance, ten-layer board glass transition temperature, and inner resin flow.

Moreover, it can be found that resin compositions comprising 1 part by weight to 15 parts by weight of core-shell rubber, 5 parts by weight to 35 parts by weight of vinyl-containing benzoxazine resin and 100 parts by weight of maleimide resin and characterized by a core-shell ratio of 6.0:4.0 to 9.5:0.5, if further containing polyphenylene ether resin, cyanate ester resin and active ester, such as Example E12, may further lower the dissipation factor without influencing other properties.

The above detailed description is merely illustrative in nature and is not intended to limit the embodiments of the subject matter or the applications and uses of such embodiments. As used herein, the term "exemplary" or similar expression means "serving as an example, instance, or illustration." Any implementation described herein as exemplary is not necessarily to be construed as preferred or advantageous over other implementations, unless otherwise specified.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments and equivalents thereof. Also, the scope defined by the claims includes known equivalents and foreseeable equivalents at the time of filing this patent application.

What is claimed is:

1. An article comprising a chemically crosslinked product of a resin composition, wherein the article comprises a prepreg, a resin film, a laminate, or a printed circuit board;
   wherein the resin composition, based on 100 parts by weight of a maleimide resin, comprises:
   (A) 1 part by weight to 15 parts by weight of a core-shell rubber;
   (B) 5 parts by weight to 35 parts by weight of a vinyl-containing benzoxazine resin; and
   (C) 100 parts by weight of the maleimide resin,
   the core-shell rubber having a core-shell ratio of 6.0:4.0 to 9.5:0.5;
   wherein the core-shell rubber comprises styrene-butadiene rubber or polybutadiene as the core and poly(methyl methacrylate) as the shell;
   wherein the vinyl-containing benzoxazine resin comprises a prepolymer of polybutadiene and benzoxazine resin, an allyl-containing bisphenol A benzoxazine resin, an allyl-containing bisphenol F benzoxazine resin, an allyl-containing dicyclopentadiene benzoxazine resin, an allyl-containing oxydianiline benzoxazine resin or a combination thereof; and
   wherein the maleimide resin comprises polyphenylmethane maleimide, bisphenol A diphenyl ether bismaleimide, 3,3'-dimethyl-5,5'-diethyl-4,4'-diphenylmethane bismaleimide, 3,3'-dimethyl-5,5'-dipropyl-4,4'-diphenylmethane bismaleimide, maleimide resin containing aliphatic long chain structure or a combination thereof.

2. The article of claim 1, having a dissipation factor at 10 GHz as measured by reference to JIS C2565 of less than or equal to 0.0072.

3. The article of claim 1, having a copper foil peeling strength as measured by using a tensile strength tester by reference to IPC-TM-650 2.4.8 of greater than or equal to 5.5 lb/in.

4. The article of claim 1, having a ten-layer board T300 thermal resistance as measured by reference to IPC-TM-650 2.4.24.1 of greater than 130 minutes.

5. The article of claim 1, having a ten-layer board glass transition temperature as measured by using a dynamic mechanical analyzer by reference to IPC-TM-650 2.4.24.4 of greater than or equal to 320° C.

6. The article of claim 1, having a ten-layer board delamination temperature as measured by using a dynamic mechanical analyzer by reference to IPC-TM-650 2.4.24.4 of greater than or equal to 350° C.

7. The article of claim 1, having an inner resin flow as measured from a lamination resin flow test of greater than or equal to 6.0 mm.

8. The article of claim 1, characterized by absence of branch-like pattern and absence of void in an open area as observed from a resin filling property test of the open area.

* * * * *